US009430497B2

(12) United States Patent
Lauenstein et al.

(10) Patent No.: US 9,430,497 B2
(45) Date of Patent: Aug. 30, 2016

(54) TRIP REPLAY FOR AN AQUATIC GEOGRAPHIC INFORMATION SYSTEM

(71) Applicant: Navico Holding AS, Egersund (NO)

(72) Inventors: Michael Lauenstein, Eagan, MN (US); Matthew Johnson, Roseville, MN (US)

(73) Assignee: NAVICO HOLDING AS, Egersund (NO)

( * ) Notice: Subject to any disclaimer, the term of this patent is extended or adjusted under 35 U.S.C. 154(b) by 0 days.

(21) Appl. No.: 14/673,459

(22) Filed: Mar. 30, 2015

(65) Prior Publication Data
US 2015/0206327 A1    Jul. 23, 2015

Related U.S. Application Data

(63) Continuation of application No. 13/948,904, filed on Jul. 23, 2013, now Pat. No. 9,104,697.

(60) Provisional application No. 61/675,304, filed on Jul. 24, 2012.

(51) Int. Cl.

| | |
|---|---|
| *G06F 17/00* | (2006.01) |
| *G06F 17/30* | (2006.01) |
| *G01B 5/18* | (2006.01) |
| *G01V 1/28* | (2006.01) |
| *G01V 1/38* | (2006.01) |
| *G01S 15/89* | (2006.01) |
| *G01V 99/00* | (2009.01) |
| *G06F 17/50* | (2006.01) |
| *G06T 17/05* | (2011.01) |
| *G01S 7/56* | (2006.01) |

(Continued)

(52) U.S. Cl.
CPC ........... *G06F 17/30241* (2013.01); *G01B 5/18* (2013.01); *G01S 7/56* (2013.01); *G01S 15/89* (2013.01); *G01S 15/8902* (2013.01); *G01V 1/282* (2013.01); *G01V 1/3808* (2013.01); *G01V 99/005* (2013.01); *G06F 17/30563* (2013.01); *G06F 17/5004* (2013.01); *G06F 17/5009* (2013.01); *G06F 17/509* (2013.01); *G06K 9/00476* (2013.01); *G06T 7/0051* (2013.01); *G06T 11/20* (2013.01); *G06T 11/60* (2013.01); *G06T 17/05* (2013.01); *G01V 2210/10* (2013.01); *G01V 2210/64* (2013.01)

(58) Field of Classification Search
CPC .......................... G06F 17/30; G06F 17/30241
USPC .................................................. 707/600–899
See application file for complete search history.

(56) References Cited

U.S. PATENT DOCUMENTS

| | | |
|---|---|---|
| 3,752,431 A | 8/1973 | McBride |
| 4,047,147 A | 9/1977 | Wood et al. |

(Continued)

*Primary Examiner* — Isaac M Woo
(74) *Attorney, Agent, or Firm* — Nelson Mullins Riley & Scarborough LLP

(57) ABSTRACT

A method of replaying measured data points includes receiving positions of a watercraft from a monitoring system, receiving sonar pings of a water body from the monitoring system at the positions of the watercraft, and aligning each of the sonar pings to each of the watercraft positions at which each of the sonar pings was taken. The method also includes generating a sonar image using the of sonar pings, providing a map of the water body, displaying the map including a pathway with an indicating point with the pathway representing the watercraft positions, and displaying the sonar image including an indicating line alongside of the contour map wherein the indicating line on the sonar image corresponds to the indicating point on the pathway.

20 Claims, 15 Drawing Sheets

(51) Int. Cl.
*G06K 9/00* (2006.01)
*G06T 7/00* (2006.01)
*G06T 11/20* (2006.01)
*G06T 11/60* (2006.01)

(56) References Cited

U.S. PATENT DOCUMENTS

| | | |
|---|---|---|
| 4,281,404 A | 7/1981 | Morrow, Jr. et al. |
| 4,282,590 A | 8/1981 | Wingate |
| 4,829,493 A | 5/1989 | Bailey |
| 4,879,697 A | 11/1989 | Lowrance et al. |
| 4,995,010 A | 2/1991 | Knight |
| 5,253,220 A | 10/1993 | Wilson, Sr. |
| 5,524,637 A | 6/1996 | Erickson |
| 6,130,641 A | 10/2000 | Kraeutner et al. |
| 6,222,449 B1 | 4/2001 | Twining |
| 6,595,315 B1 | 7/2003 | Fujimoto et al. |
| 6,628,569 B1 | 9/2003 | Steiner et al. |
| 7,161,872 B2 | 1/2007 | Kuriyama et al. |
| 7,224,642 B1 | 5/2007 | Tran |
| 7,236,426 B2 | 6/2007 | Turner et al. |
| 8,417,451 B2 | 4/2013 | Hersey et al. |
| 2004/0097802 A1 | 5/2004 | Cohen |
| 2004/0249860 A1 | 12/2004 | Stechschulte et al. |
| 2005/0162976 A1 | 7/2005 | Kuriyama et al. |
| 2005/0211812 A1 | 9/2005 | Nakagawa et al. |
| 2006/0018197 A1 | 1/2006 | Burczynski et al. |
| 2006/0050613 A1 | 3/2006 | Turner |
| 2006/0123050 A1* | 6/2006 | Carmichael et al. .......... G06K 9/00885 |
| 2007/0025591 A1 | 2/2007 | Rhoads et al. |
| 2007/0223310 A1 | 9/2007 | Tran |
| 2008/0080317 A1 | 4/2008 | Inouchi et al. |
| 2010/0036880 A1 | 2/2010 | Carpenter |
| 2010/0141518 A1 | 6/2010 | Hersey et al. |
| 2012/0232719 A1 | 9/2012 | Salmon et al. |

* cited by examiner

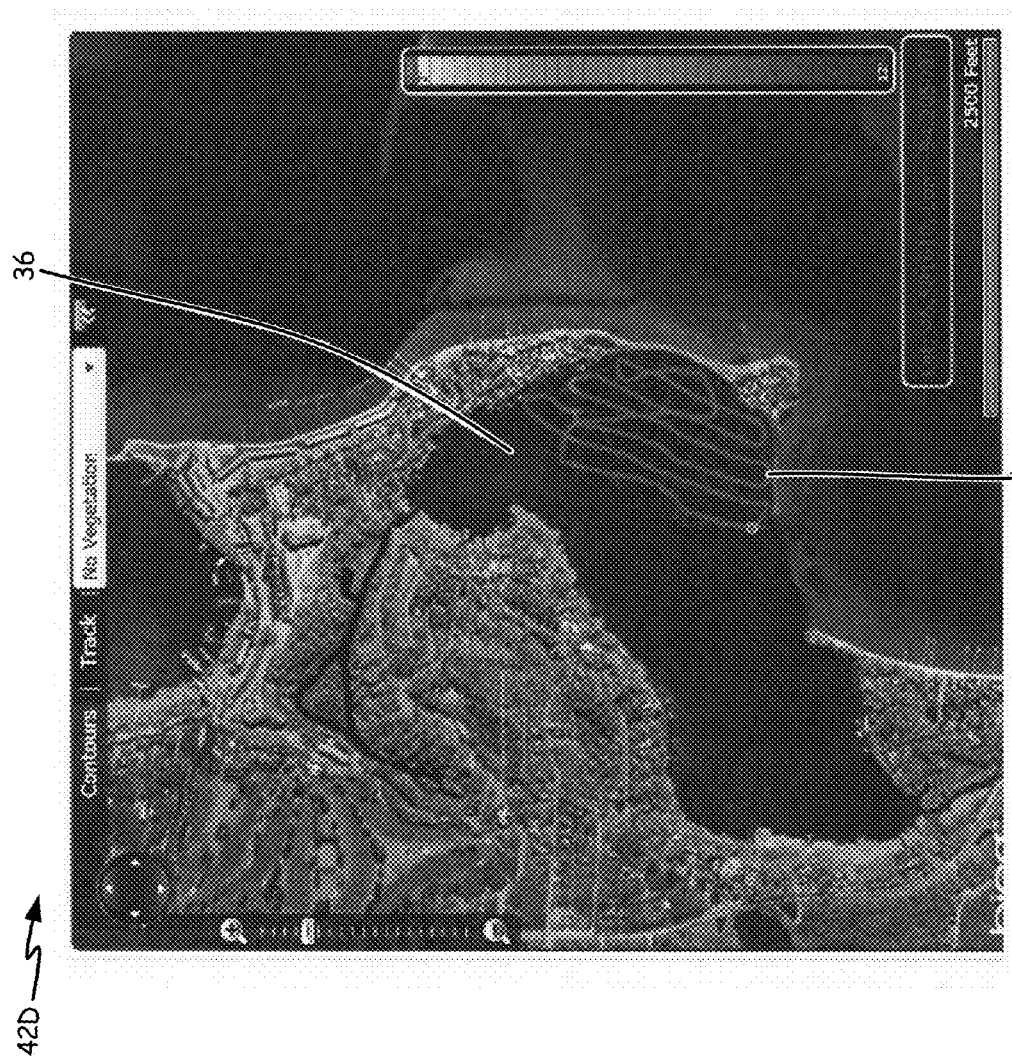

TRIP REPLAY FOR AN AQUATIC GEOGRAPHIC INFORMATION SYSTEM

CROSS-REFERENCE TO RELATED APPLICATION(S)

This application claims priority to U.S. patent application Ser. No. 13/948,904, filed on Jul. 23, 2013, and entitled "AQUATIC GEOGRAPHIC INFORMATION SYSTEM," which claims priority to U.S. Provisional Patent Application No. 61/675,304, filed on Jul. 24, 2012, and entitled "AQUATIC GEOGRAPHIC INFORMATION SYSTEM," the disclosures of which are incorporated by reference in their entirety.

This application is also related to U.S. patent application Ser. No. 14/673,267 filed on Mar. 30, 2015, and entitled "REPORTING FOR AN AQUATIC GEOGRAPHIC INFORMATION SYSTEM"; U.S. patent application Ser. No. 14/673,318 filed on Mar. 30, 2015, and entitled "CONTOUR INTERVAL CONTROL FOR AN AQUATIC GEOGRAPHIC INFORMATION SYSTEM"; U.S. patent application Ser. No. 14/673,344 filed on Mar. 30, 2015, and entitled "POLYGON CREATION FOR AN AQUATIC GEOGRAPHIC INFORMATION SYSTEM"; and U.S. patent application Ser. No. 14/673,406 filed on Mar. 30, 2015, and entitled "ELEVATION ADJUSTMENT FOR AN AQUATIC GEOGRAPHIC INFORMATION SYSTEM".

BACKGROUND

Geographic information systems (GIS) are used to manage many types of information about the earth. Data points representing information such as altitude or plant growth can be mapped using global positioning system data to create layers in a GIS. GIS can even be used to analyze areas that are covered with water, such as aquatic environments. GIS can get input from many different sources, including aerial photographs and acoustic sounders. In this manner, data can be organized and mapped to specific areas of the planet.

Depth finders/acoustic sounders mounted on watercraft are often used by scientists and sportsmen/women for various purposes. For example, a scientist may want to detect and measure aquatic plant growth in a lake. For another example, an angler may want to find fish in a river or identify trends in each item located by sounding. A typical depth finder display shows the depth of the water beneath the boat and possibly information regarding what is to the sides of the boat. This information is only displayed for a short period of time, as the display is constantly being updated with new data. While depth finder data can be used to create a GIS layer, the data collected by a depth finder depends on the path taken by the boat. This data is not easily entered into GIS software that stores data according to absolute coordinates.

SUMMARY

According to one embodiment of the present invention, a method of replaying measured data points includes receiving positions of a watercraft from a monitoring system, receiving sonar pings of a water body from the monitoring system at the positions of the watercraft, and aligning each of the sonar pings to each of the watercraft positions at which each of the sonar pings was taken. The method also includes generating a sonar image using the of sonar pings, providing a map of the water body, displaying the map including a pathway with an indicating point with the pathway representing the watercraft positions, and displaying the sonar image including an indicating line alongside of the contour map wherein the indicating line on the sonar image corresponds to the indicating point on the pathway.

In another embodiment, a geographic information display system includes a map display having a map, a pathway superimposed on the map representing a plurality of coordinate data points, a movable indicating point on the pathway. The system also includes a sonar display alongside of the map display, the sonar display having a movable sonar image representing a plurality of sonar pings and an indicating line on the sonar image that corresponds to the indicating point on the pathway.

BRIEF DESCRIPTION OF THE DRAWINGS

FIG. 6A shows a report generated from the GIS System for a lake that has been partially traversed.

DETAILED DESCRIPTION

Figure 1:
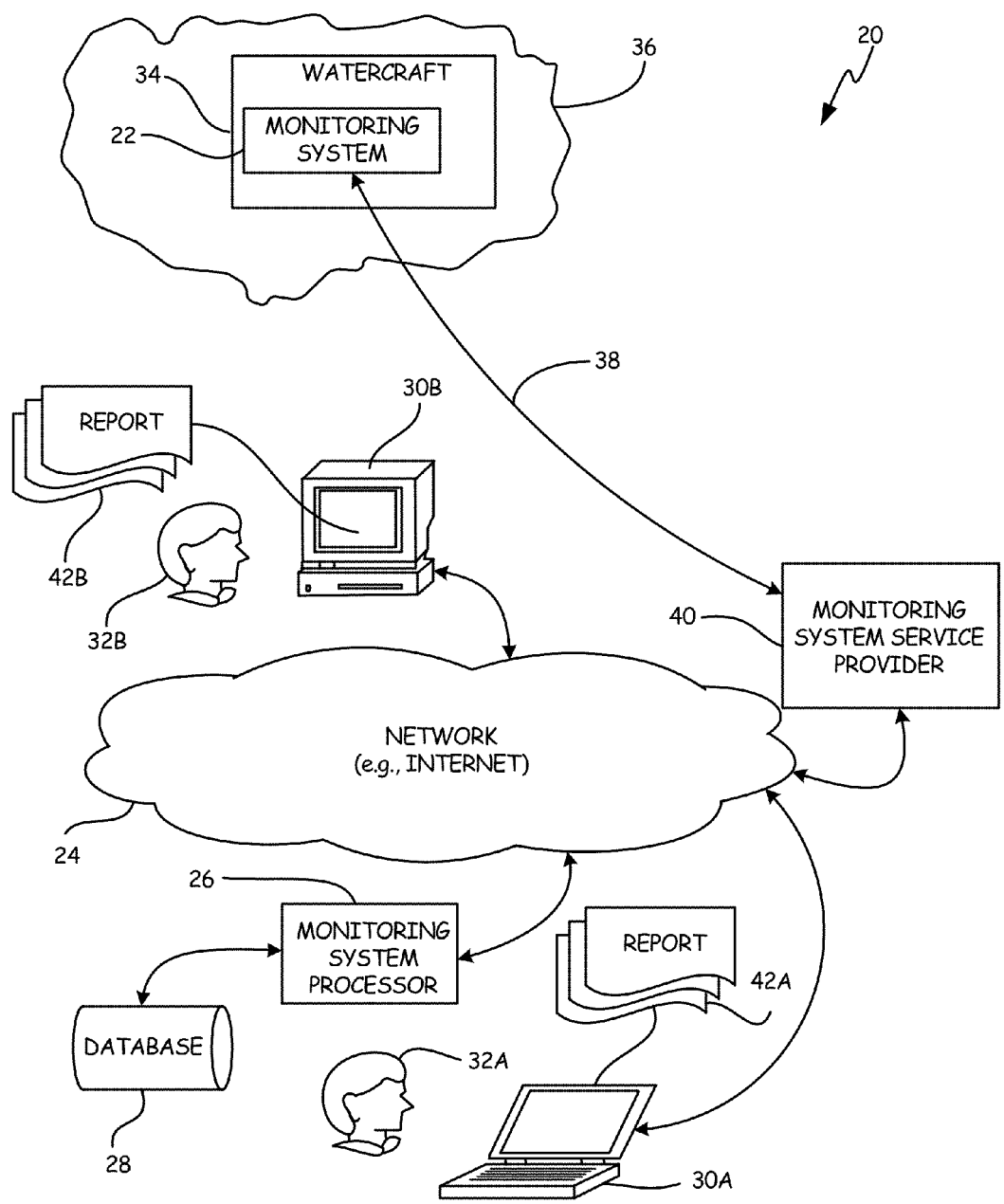
FIG. 1 shows a block diagram showing architecture of an automatic aquatic geographic information system (GIS).
Figure 2:
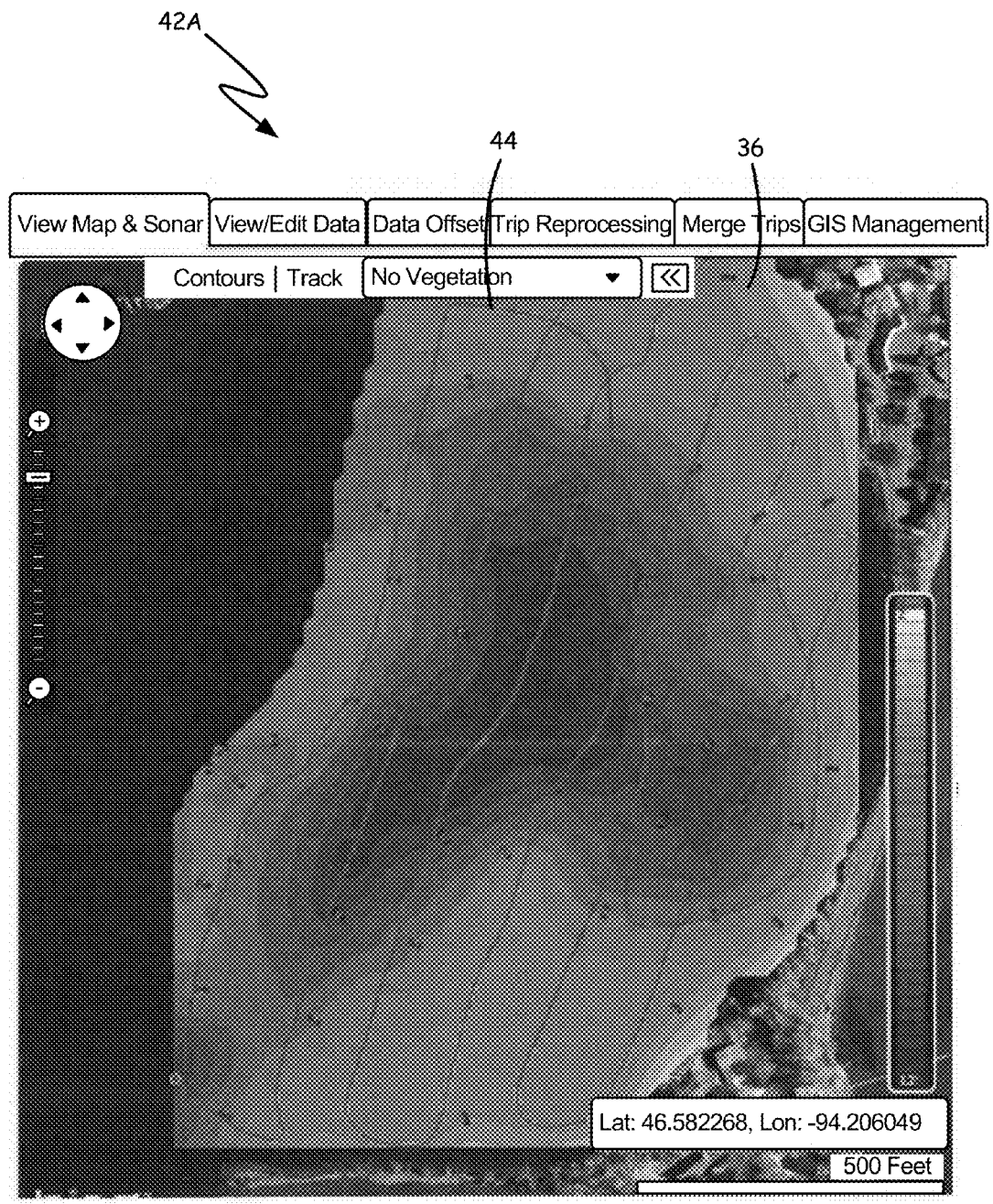
FIG. 2 shows an automatically generated output report from the GIS System.

In FIG. 1, architecture of an aquatic geographic information system (GIS) 20 is shown. In FIG. 2, an example report 42A from GIS 20 is shown. FIGS. 1-2 will now be discussed simultaneously.

In the illustrated embodiment, GIS 20 includes monitoring system 22, network 24, server 26, database 28, user computers 30A-30B, and users 32A-32B. Monitoring system 22 is mounted on watercraft 34, such as a boat, that can be piloted on water body 36, such as a lake, river, ocean, reservoir, etc. Monitoring system 22 includes a clock, a global positioning system (GPS) unit, a thermometer, and a sonar unit.

Monitoring system 22 has data link 38 that connects monitoring system to service provider 40. Data link 38 can comprise one of the many known data link types, such as a cellular telephone network, a satellite network, a short-range wireless connection, or a hardwired connection, among other things. Service provider 40 is connected to network 24, such as the internet. Server 26 is connected to network 24, and server 26 is also connected to database 28. In addition, there is a plurality of user computers 30A-30B connected to network 24, with each user computer 30A-30B having a user 32A-32B, respectively.

As watercraft 34 is driven by user 32A along pathway 44 on water body 36, monitoring system 22 takes a series of measurements (called "pings" or "data points") of various parameters and records them with a timestamp that includes the date down to the microsecond level. In the illustrated embodiment, these parameters can include, but are not limited to, location, water temperature, water depth, plant height, and bottom hardness/softness. The pings are sent through data link 38, service provider 40, and network 24 in order to reach server 26. As will be explained later in greater detail with FIG. 2, server 26 compiles the pings into a single image automatically. Each image is then entered into database 28 and is associated with a user identifier, a trip identifier, and a water body identifier.

In order for user 32A to retrieve the images stored on database 28, user 32A must first be authenticated by server 26. Once server 26 is satisfied that user 32A is in fact user 32A, server 26 authorizes user 32A to gain access to particular entries on database 28. For example, user 32A may be granted access to his/her own entries. For another example, user 32A and user 32B can agree to share data, whereby server 26 groups the access rights for user 32A with the access rights for user 32B. Thereby, user 32A can access user 32B's entries and user 32B can access user 32A's entries. Although each user 32A-32B can decide on his/her own whether to join a group in order to share data or keep his/her data to him/herself.

In addition, multiple users 32 that are part of the same group can upload images to server 26 of the same water body 36. In this scenario, server 26 merges the images into a single database entry image of water body 36. In such a function the data points and images do not need to be reprocessed, instead the data points there are combined and then processed together.

After server 26 has processed an image from user 32A, report 42A is sent to user computer 30A. In general, report 42A includes information regarding the parameters of water body 36 and of the trip itself. More specifically, report 42A can include statistics about an image such as: total number of pings processed; data collector GPS references; file types; trip conditions; collection data set; raw data; transect lengths 46 (the distances between adjacent passes of pathway 44); and more detailed analysis of transect lengths 46. Report 42A can also include a data layer from a processed image that is superimposed over an aerial view of water body 36. Such a data layer can include data analysis output regarding: percent of water body 36 traversed; total percent of water body 36 traversed (for merged images); water depths; plant percent biovolume (which relates to how much of the water in water body 36 is occupied by plants); total plant percent biovolume; correlation between water depth and plant percent biovolume; water temperatures; manual data entry points (for example, an area of 100% biovolume that could not be traversed by watercraft 34). The processed output in report 42A is created using a uniform set of parameters. Thereby, report 42A can be directly compared to report 42B even if report 42B.

The components and configuration of GIS 20 as shown in FIGS. 1-2 allow for the measuring, transmission, processing, storage, and reviewing of geographic data, specifically data related to bodies of water. Such measurement of bodies of water can be crowdsourced, meaning that if user 32A can collects information from one-half of a particular water body 36 and user 32B collects information from the other half of that same water body 36, both users 32A-32B will have data for the entire water body 36. Similarly, if multiple users 32 share information about multiple water bodies 36, every user 32 does not need to personally measure each water body 36 to gain information about all of the water bodies 36. Alternatively, user 32A and user 32B can each have private information about the same water body 36 if users 32A-32B would so prefer. In addition, report 42A regarding water body 36 can be used to establish baseline to which report 42B can be compared. This is especially useful if the information for report 42B is collected at a later time or from a different water body 36 than that of report 42A.

Illustrated in FIGS. 1-2 is one embodiment of the present invention, to which there are alternative embodiments. For example, GIS 20 can measure and process other types of data, such as barometric pressure or biomass.

Figure 3:
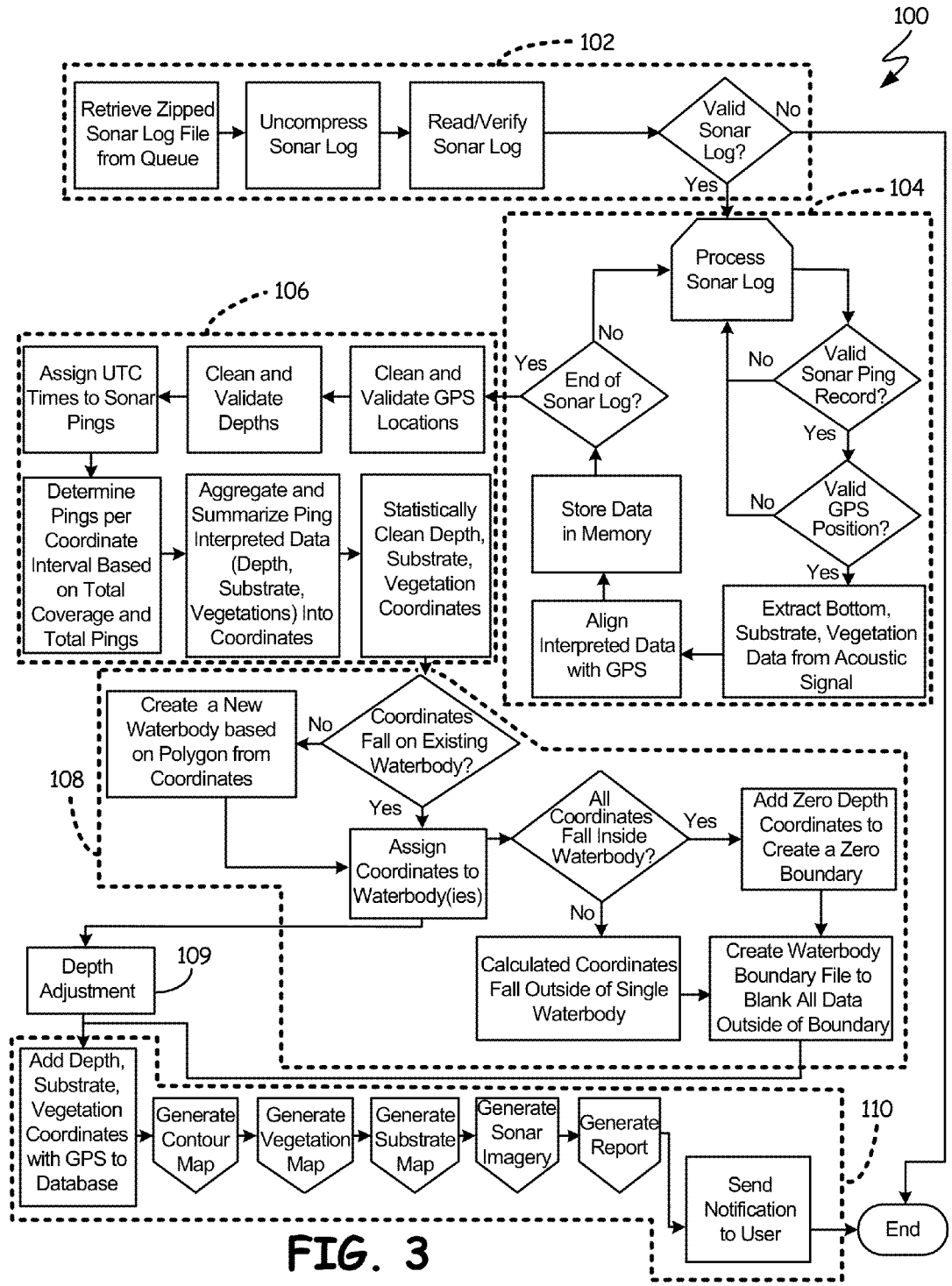
FIG. 3 shows a flow chart of automated processing of geo-statistical data.

In FIG. 3, a flow chart showing automated processing 100 of geo-statistical data is shown. In the illustrated embodiment, server 26 (shown in FIG. 1) prepares a sonar log containing pings that was created by monitoring system 22 (shown in FIG. 1) at step 102. At this step, the sonar log is read and checked for validity. At step 104, acoustic data points and coordinate data points are extracted and aligned, which is the first level of summarization of the data from monitoring system 22. Then, the coordinate data is statistically aggregated, cleaned, and validated at step 106. The data is also geospatially validated at step 108. Then at step 109, the depth values of the data are adjusted, if necessary. Finally, at step 110 an output is created as the second level of summarization of the data, and a notification is sent to user computer 30A (shown in FIG. 1). The output of automated processing 100 will be discussed later with FIGS. 4A-4E, although in general, the output can include a contour map, a vegetation map, a substrate or bottom hardness map, a sonar image, or a report 42A.

The steps of automated processing 100 as shown in FIG. 3 allow for parameters to be measured by user 32A and report 42A to be created without requiring user 32A to manually convert the sonar data and coordinate data into an output.

Figure 4A:
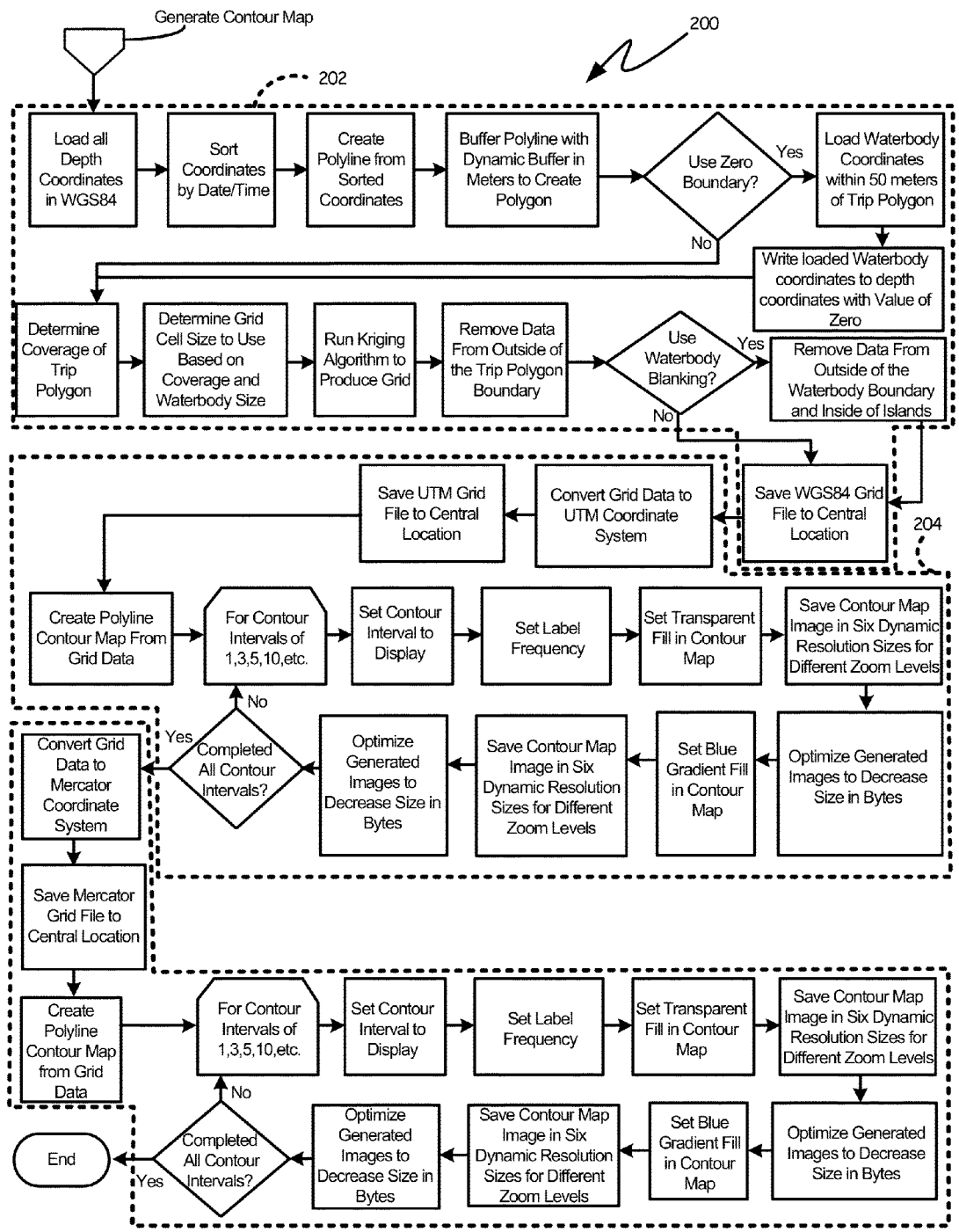
FIG. 4A shows a flow chart of automated contour map generation for geo-statistical data.

In FIG. 4A, a flow chart of automated contour map generation 200 for geo-statistical data is shown. Specifically, depth data is being output in automated contour map generation 200 that creates a topographical representation of the bottom of water body 36 (shown in FIG. 1). In the illustrated embodiment, server 26 (shown in FIG. 1) formats the coordinate data at step 202. The coordinate data is output in decimal degrees format without a map. At step 204, a Universal Transverse Mercator (UTM) contour map is created using the coordinate data that allows for the data to be exported or displayed without a background. At step 206, a Mercator contour map is created that can be displayed over a background, such as an aerial photograph of water body 36 or another map.

Figure 4B:
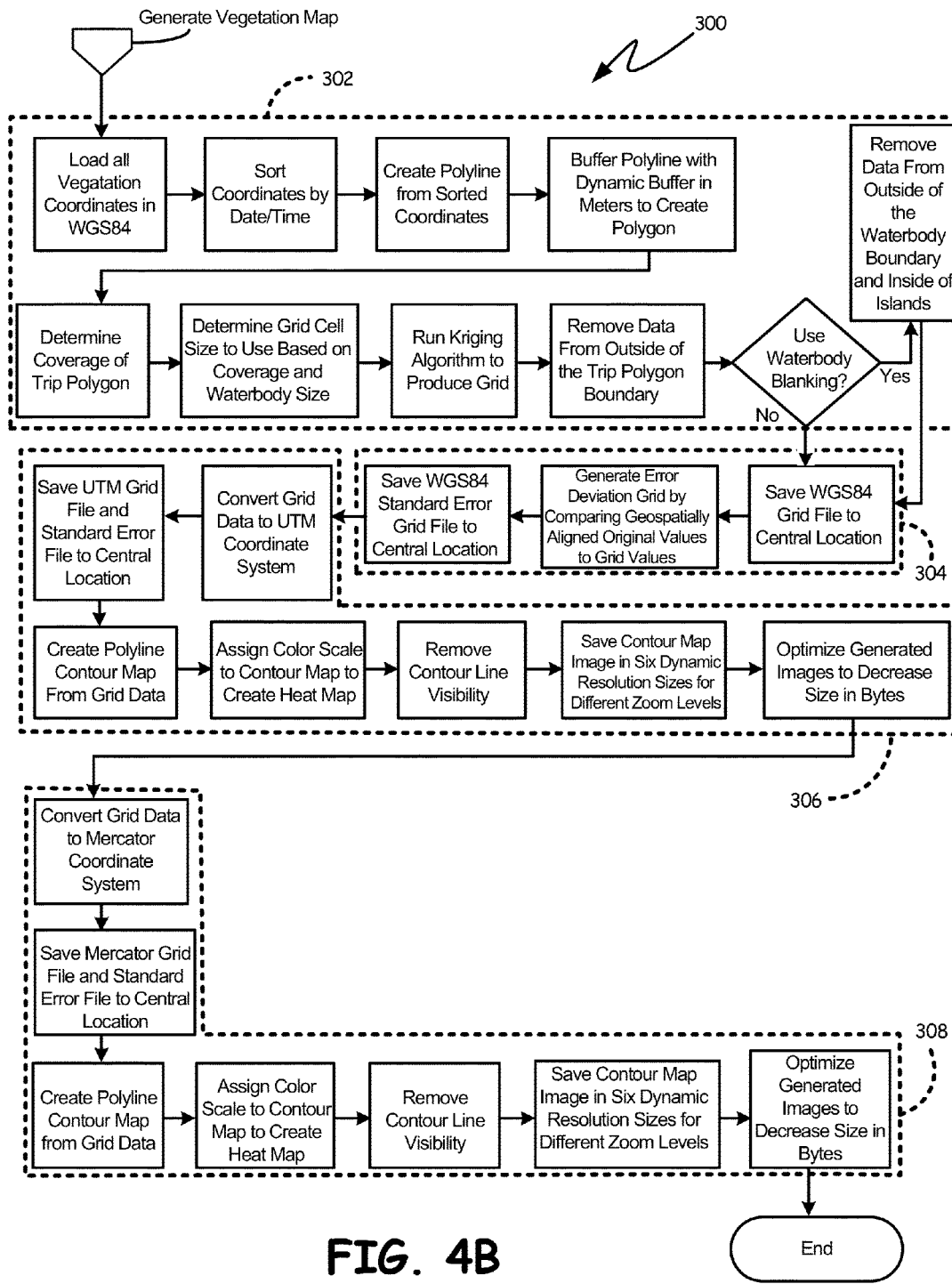
FIG. 4B shows a flow chart of automated vegetation map generation for geo-statistical data.

In FIG. 4B, a flow chart of automated vegetation map generation 300 for geo-statistical data is shown. Specifically, vegetation data is being output in automated vegetation map generation 300. In the illustrated embodiment, server 26 (shown in FIG. 1) formats and analyzes the coordinate data at step 302. The coordinate data is output in decimal degrees format without a map at step 304. At step 306, a UTM contour map is created using the coordinate data that allows for the data to be exported or displayed without a background. At step 308, a Mercator contour map is created that can be displayed over a background, such as an aerial photograph of water body 36 (shown in FIG. 1) or another map.

Figure 4C:
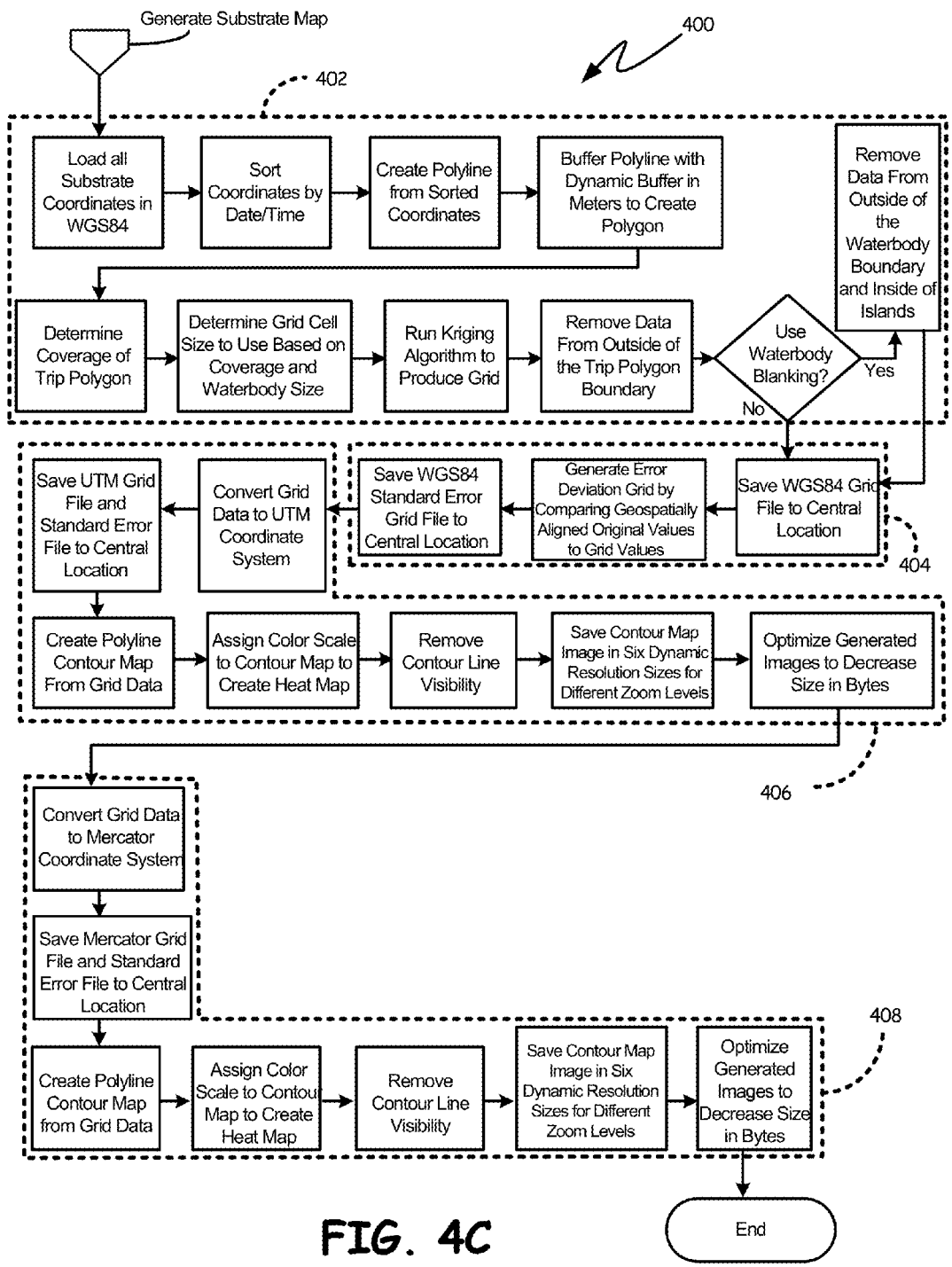
FIG. 4C shows a flow chart of automated substrate map generation for geo-statistical data.

In FIG. 4C, a flow chart of automated substrate map generation 400 for geo-statistical data is shown. Specifically, substrate or bottom hardness data is being output in automated substrate map generation 400. In the illustrated embodiment, server 26 (shown in FIG. 1) formats and analyzes the coordinate data at step 402. The coordinate data is output in decimal degrees format without a map at step 404. At step 406, a UTM contour map is created using the coordinate data that allows for the data to be exported or displayed without a background. At step 408, a Mercator contour map is created that can be displayed over a background, such as an aerial photograph of water body 36 (shown in FIG. 1) or another map.

Figure 4D:
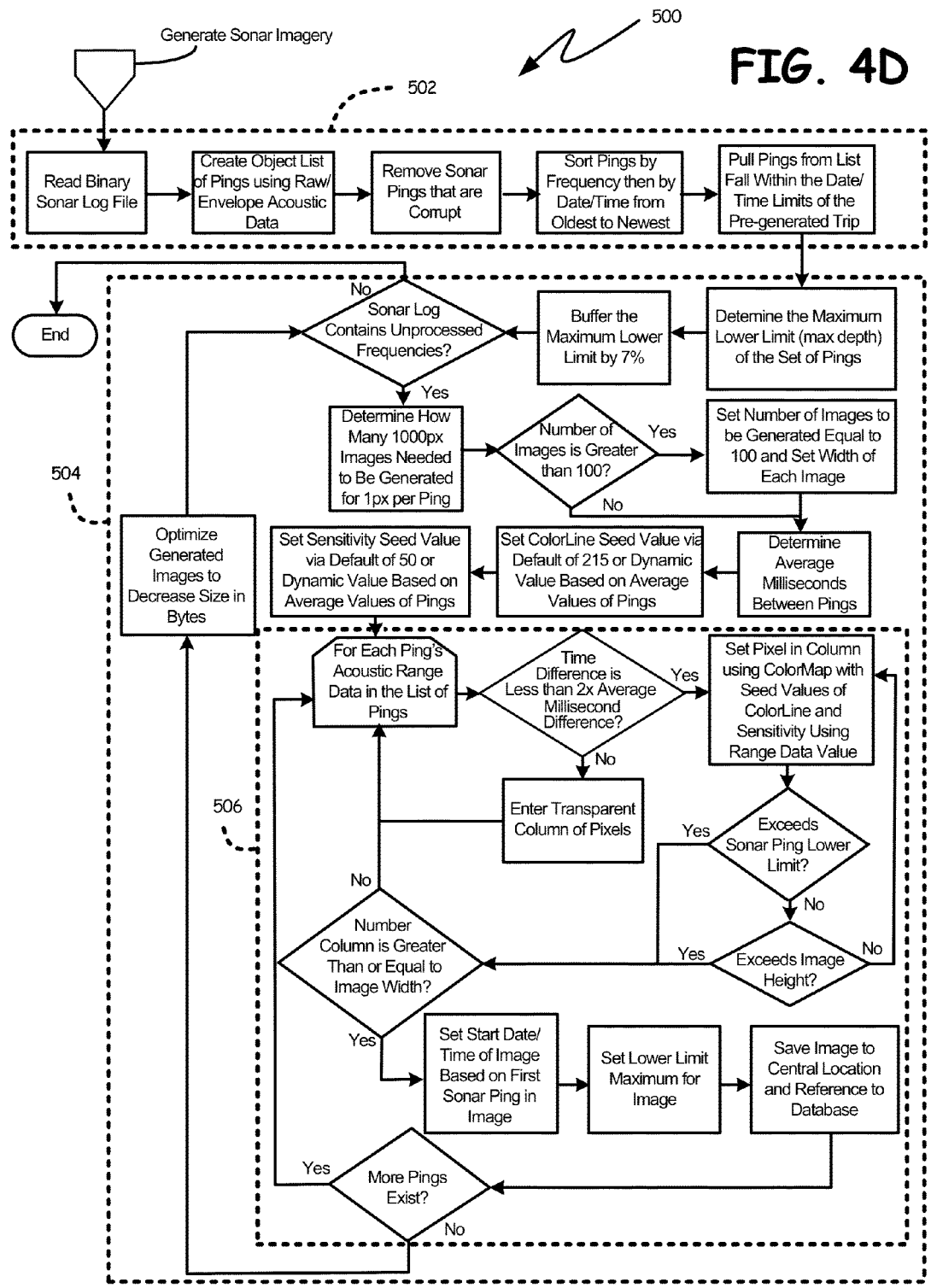
FIG. 4D shows a flow chart of automated sonar imagery generation for geo-statistical data.

In FIG. 4D, a flow chart of automated sonar imagery generation 500 for geo-statistical data is shown. Specifically, a sonar image is being output in automated sonar imagery generation 500. In the illustrated embodiment, server 26 (shown in FIG. 1) reads and cleans the sonar log pings at step 502. At step 504, an image is generated by adding individual pixel widths that are themselves generated at step 506. If necessary, an extremely long sonar image can be created by adding multiple sonar images together (not shown).

Figure 4E:
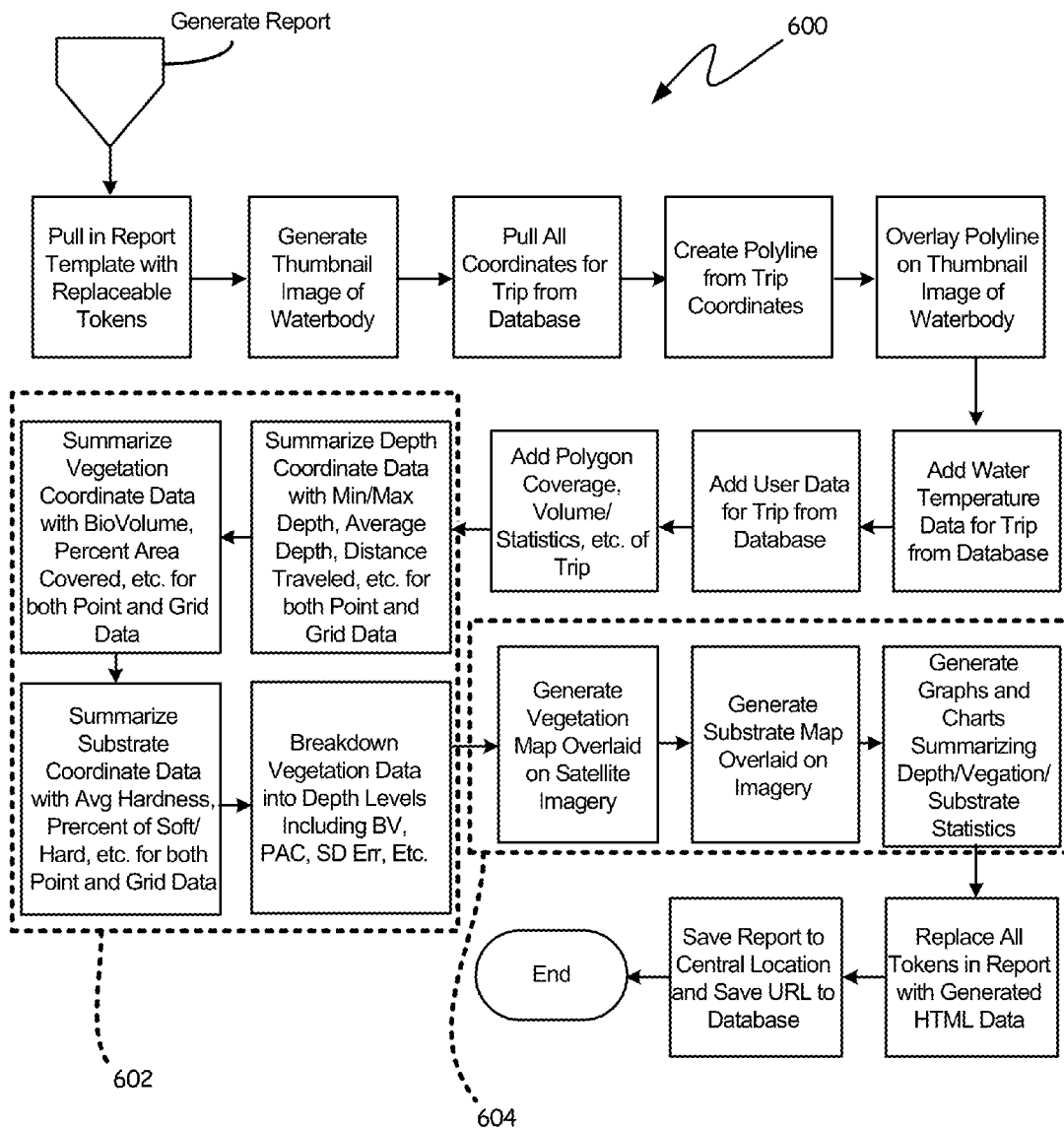
FIG. 4E shows a flow chart of automated report generation for geo-statistical data.

In FIG. 4E, a flow chart of automated report generation 600 for geo-statistical data is shown. Specifically, the outputs of automated report generation 600 can include measured or calculated parameters as well as further processed outputs of automated generations 300, 400, 500, and/or 600. For example, at step 602, average depth, percent of area covered by plants, and average hardness can be calculated. Furthermore, statistical correlations of parameters such as vegetation biovolume or substrate hardness can be made at each contour level (i.e. at each depth range). For another example, at step 604, imagery display information is created, such as an overlay of the outputs of automated generations 300, 400, 500, and/or 600 upon an aerial photograph of water body 36 (shown in FIG. 1). Further, also at step 604, graphical display information can be created, including visual representations of the outputs generated at step 602.

The steps of automated contour map generation 200, automated vegetation map generation 300, automated substrate map generation 400, automated sonar imagery generation 500, and automated report generation 600 as shown in FIGS. 4A-4E, respectively, allow for the data collected by monitoring system 22 (shown in FIG. 1) to be visualized and used in a meaningful way by at least user 32A (shown in FIG. 1). This feat is accomplished without requiring much if any work to be done by user 32A him/herself beyond collecting data with monitoring system 22.

Figure 5:
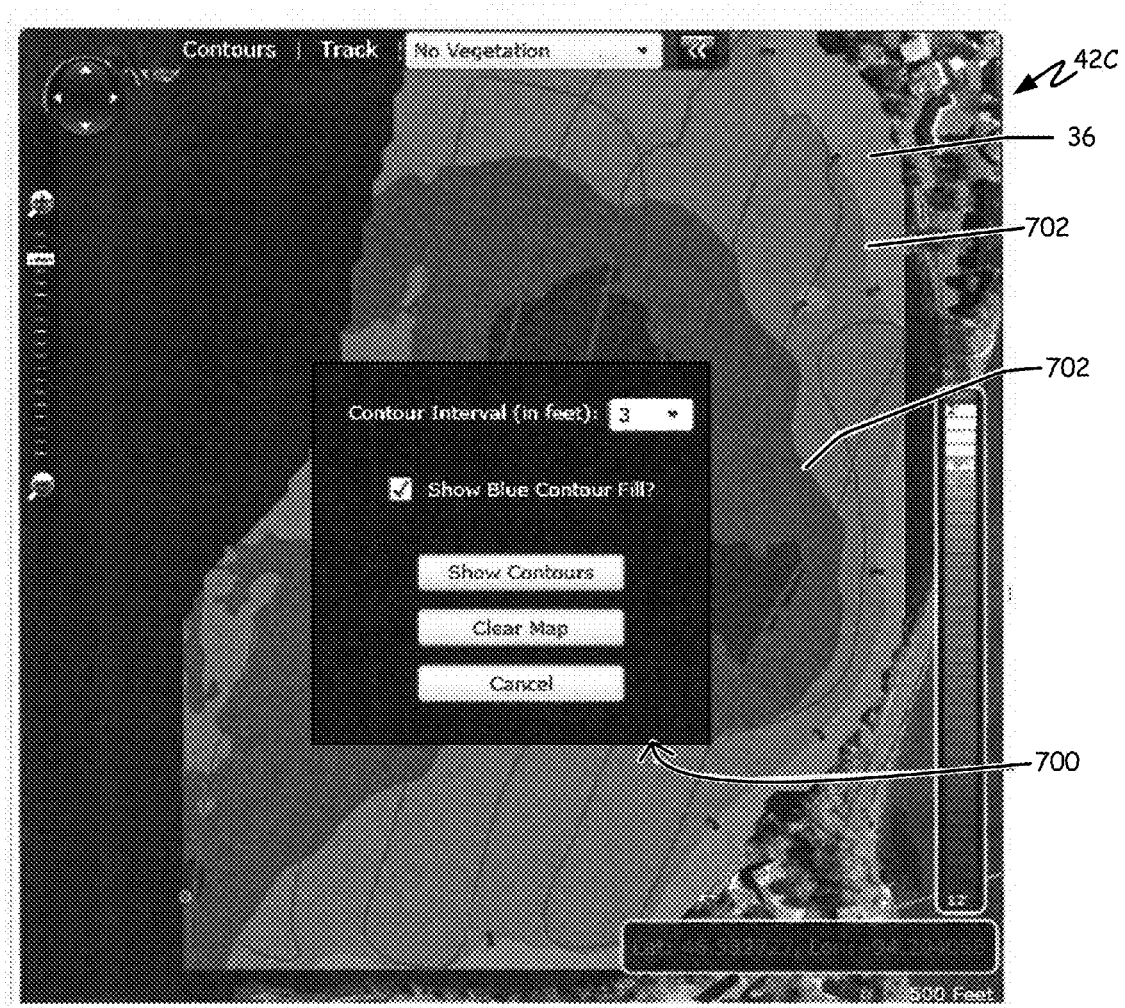
FIG. 5 shows a report generated from the GIS System including an automated and interactive contour interval control.

In FIG. 5, report 42C generated from GIS 20 including contour interval control 700 is shown. When server 26 (shown in FIG. 1) performs automated contour map generation 200 (shown in FIG. 4A), a plurality of reports 42C are made and stored in database 28 (shown in FIG. 1). Each of the plurality of reports 42C has a different depth range at which contours 702 are placed to represent topographical changes in depth. In the illustrated embodiment, the depth range is 0.91 meters (3 feet), meaning that a contour 702 is placed where the depth is 3 feet, 6 feet, 9 feet, etc. This is in contrast to report 42A (shown in FIG. 2) where the depth range is 0.30 meters (1 foot). This is evidenced by fewer contours 702 existing in report 42C than in report 42A.

User 32A can select which depth range is most desirable, and server 26 (shown in FIG. 1) will send the corresponding report 42. Which report 42 is most desirable can be dependent on how large water body 36 is and how close user 32A has zoomed in on report 42. If the depth range is shallow and the view of a report 42 is fully zoomed out, there may be too many contour lines 702 that are crowded together. This can destroy the usefulness of a report 42. Some exemplary, non-limiting depth ranges that server 26 can create are 1 foot, 3 feet, 5 feet, and 10 feet.

Figure 6B:
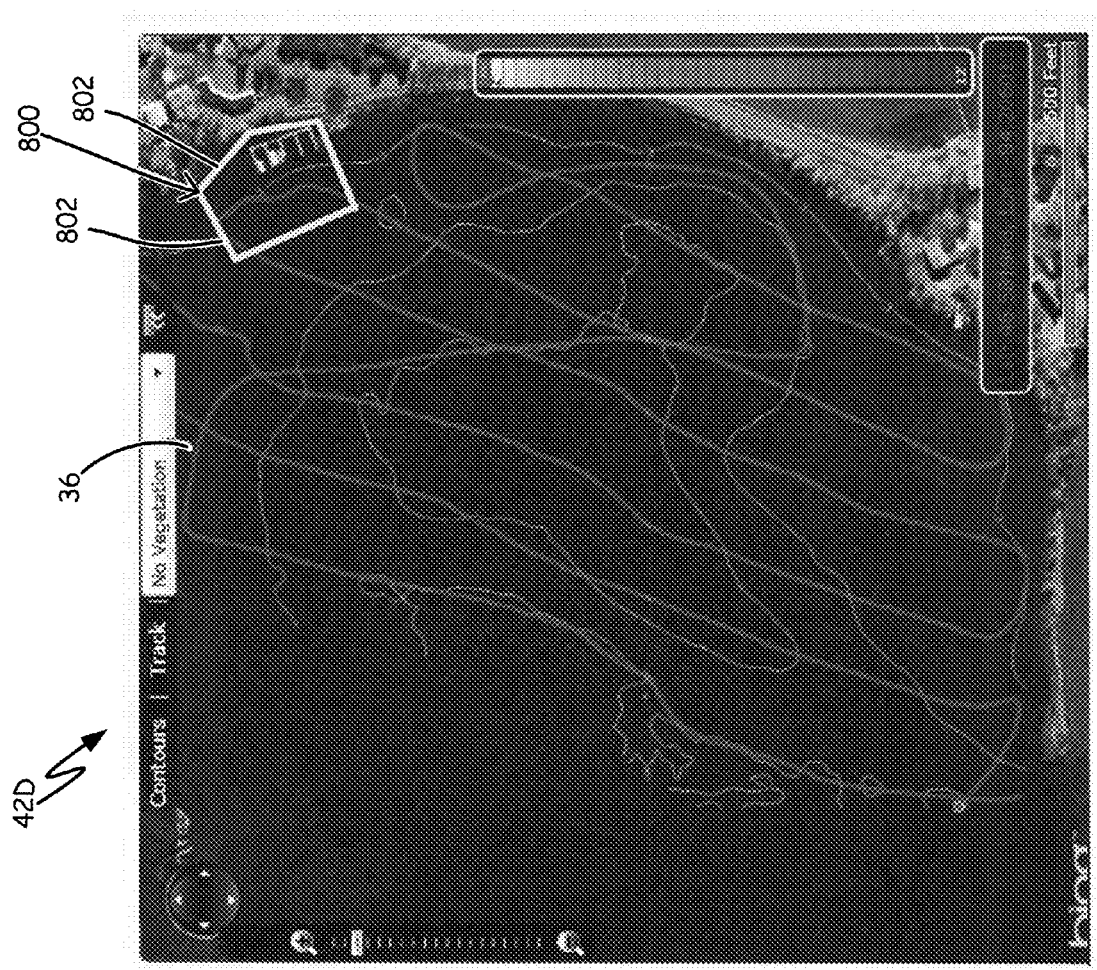
FIG. 6B shows a portion of a report generated from the GIS System including a zoomed view and higher resolution of the report.

In FIG. 6A, report 42D generated from GIS 20 for water body 36 that has been partially traversed is shown. In FIG. 6B, a portion of report 42D generated from GIS 20 including user-created polygon 800 is shown. It should be noted that if user 32A (shown in FIG. 1) had traversed pathway 44, if user 32B (shown in FIG. 1) had traversed the remainder of water body 36, and if users 32A-32B were grouped together, the merging of their data would produce allow for the analysis of the entirety of water body 36. (Although it would be best if users 32A-32B performed their data collection close in time to prevent the seasonal cycles of plant growth from rendering a combination of the data misleading.)

On the other hand, user 32A can analyze a subset of the data in report 42D. This is accomplished by creating polygon 800. Polygon 800 is comprised of a plurality of straight edges 802 that form a closed shape. Within polygon 800, server 26 (shown in FIG. 1) can perform at least a portion of automated report generation 600 (shown in FIG. 4E). For example, using depth data, the total volume of water located within polygon 800 can be calculated, as could average percent biovolume.

Figure 7:
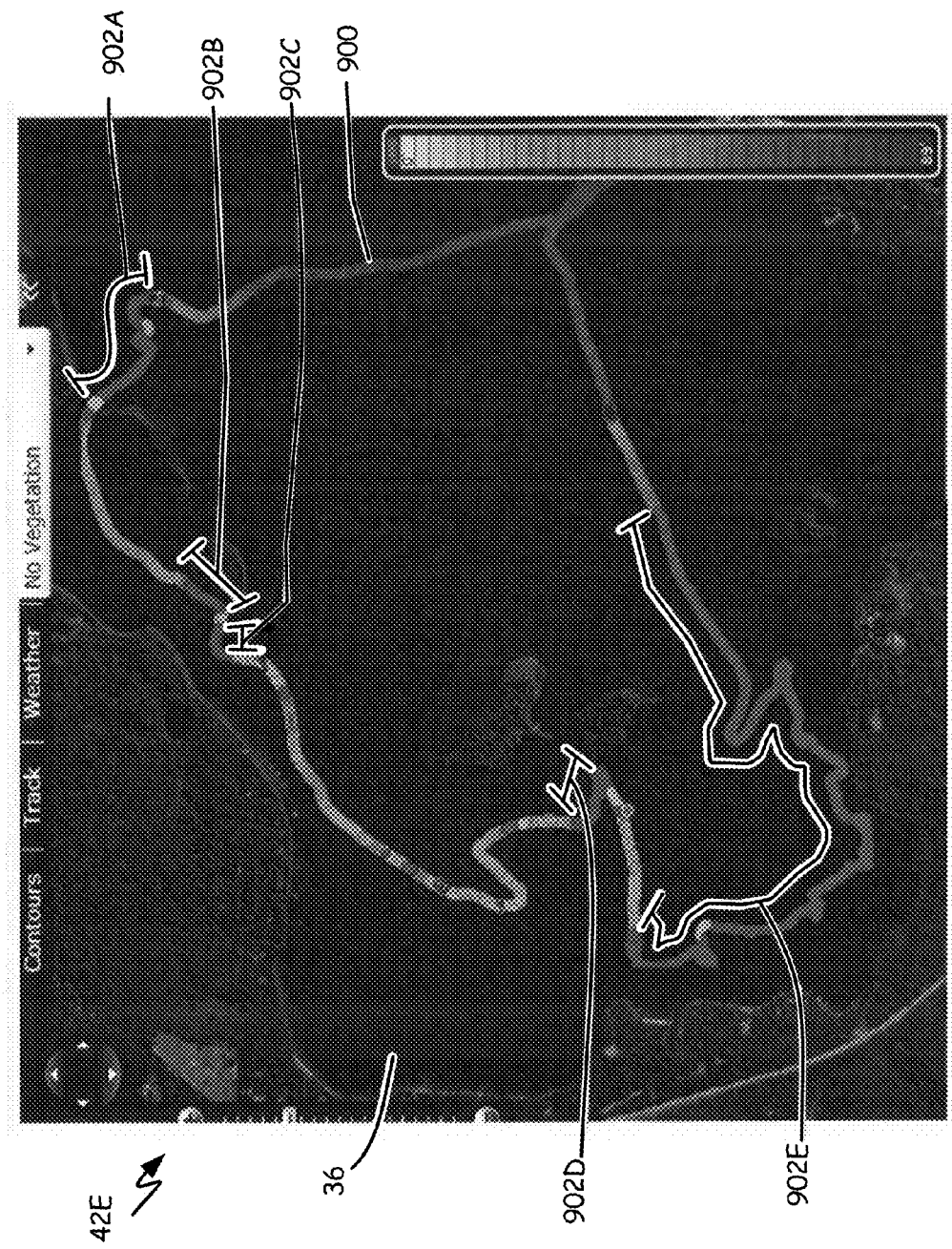
FIG. 7 shows a report generated from the GIS System including automated altitude adjustment and data offset.

In FIG. 7, report 42E generated from the GIS including automated altitude adjustment and data offset is shown. In the illustrated embodiment, one of the parameters monitored by monitoring system 22 (shown in FIG. 1) can include elevation (which is a component of the GPS location). While any individual measurement of elevation along pathway 900 may deviate from the actual elevation, the average elevation collected at each ping can give a very accurate value for elevation (given that the water in water body 36 is substantially flat) that can be indicated in report 42E. If there were another data set to be merged with the data preceding report 42E, the average elevation of that data set can be calculated. Thereby, the difference of the two average elevations can be calculated. Then this value can either be subtracted from every depth value of the higher one or added to every depth value of the lower one to simulate both data sets being measured at the same water level in water body 36. This would allow the two data sets to be merged even if the water level in water body 36 had greatly fluctuated between the time the first data set was created and the time the second data set was created. Such a depth adjustment process can occur, for example, at step 109 (shown in FIG. 3) and can be performed by, for example, monitoring system processor 26 (shown in FIG. 1).

Such a merging of data can occur using external data, such as in the case of a reservoir drawdown. In this instance, the known drawdown level could be added or subtracted from the depth data of one of the data sets in order to merge the two.

In addition, a drawdown of a known magnitude can be simulated in report 42E. The data for report 42E was originally gathered when the entirety of the land under pathway 900 was under water body 36. During the generation of report 42E, all of the depth data has a certain value added or subtracted from it. This can be used to compensate for how far below the waterline the sonar unit is located on watercraft 34 (shown in FIG. 1). In the illustrated embodiment, this data offset is used to simulate water body 36 having a substantially lowered water level. Report 42E shows a plurality of sandbars 902A-902E (shown in green) wherein the land formerly under water body 36 would be exposed. This can be a useful navigational tool to indicate that pathway 900 would no longer be an acceptable route to take if the water level of water body 36 were to reach (or in some cases, merely approach) the simulated water level in report 42E.

Figure 8A:
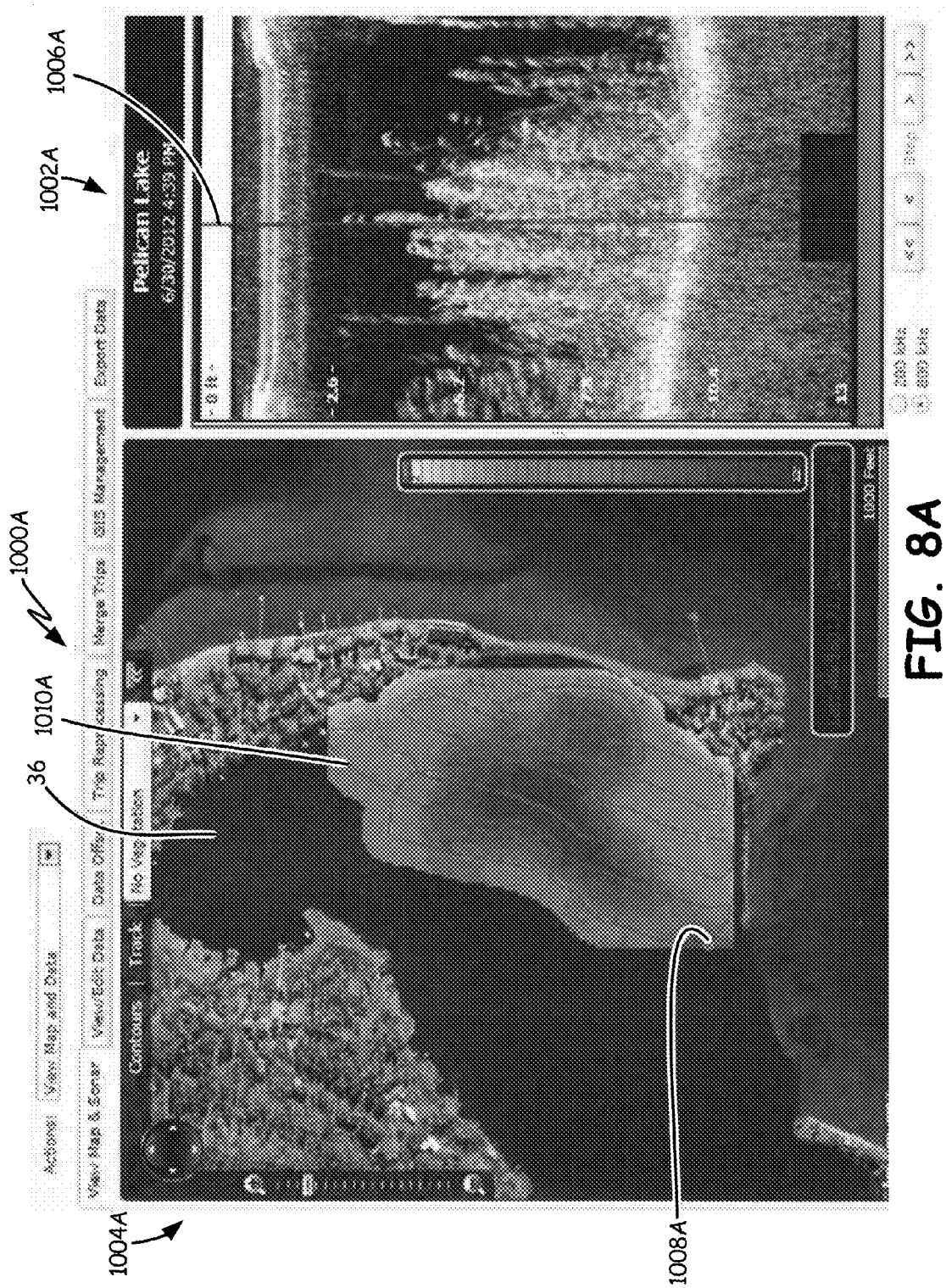
FIG. 8A shows a trip replay generated from the GIS System with depth information.
Figure 8B:
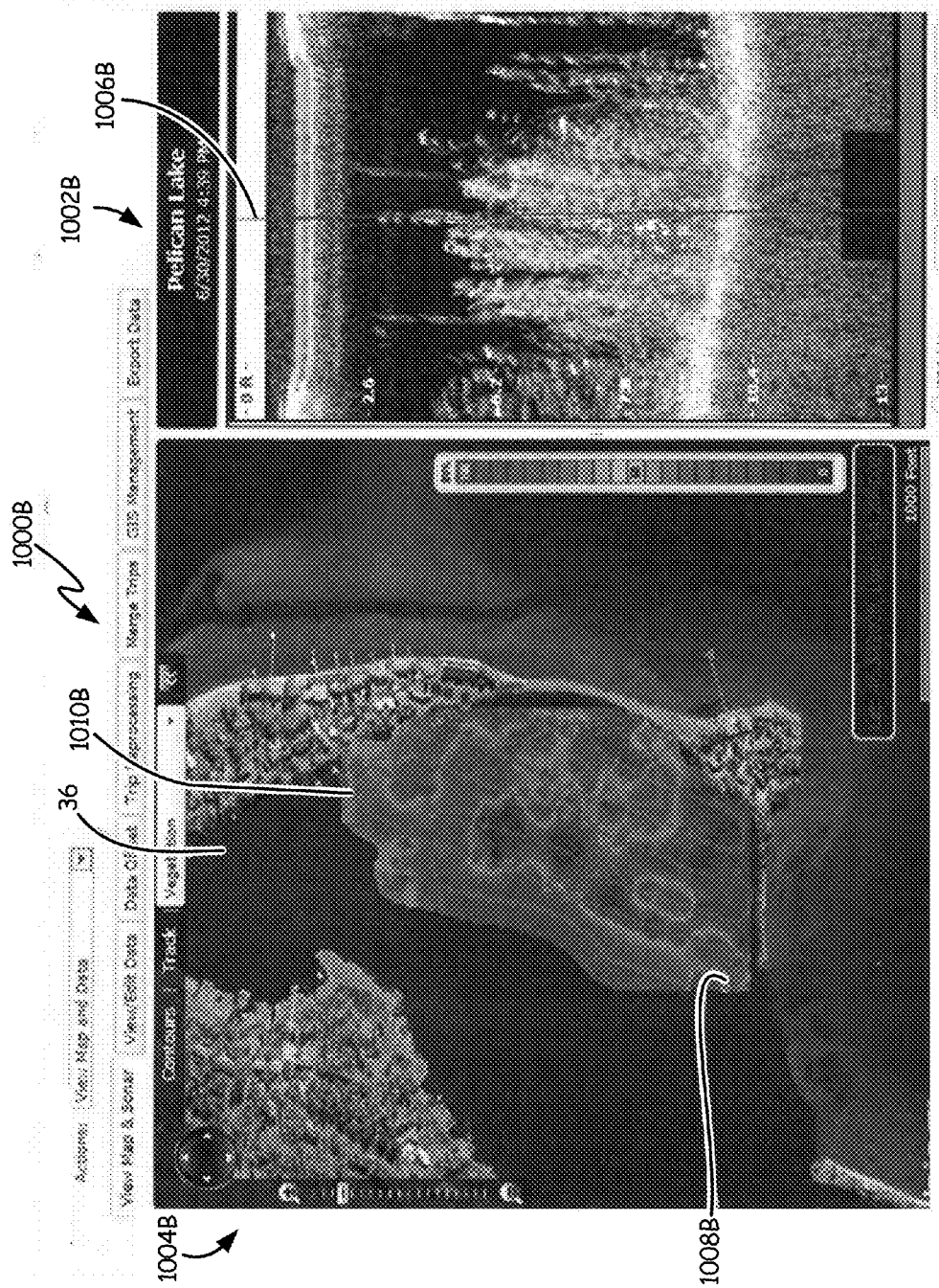
FIG. 8B shows a trip replay generated from the GIS System with vegetation information.

In FIG. 8A, trip replay 1000A generated from GIS 20 with depth information is shown. In FIG. 8B, trip replay 1000B generated from GIS 20 with vegetation information is shown. While FIGS. 8A-8B are similar, FIG. 8A includes depth contours without vegetation data while FIG. 8B includes vegetation data.

When server 26 (shown in FIG. 1) performed automated processing 100 (shown in FIG. 3) sonar data was aligned with coordinate data. Thereby, when automated contour map generation 200 (shown in FIG. 4A) is performed, trip replay 1000A can be created. (Similarly, when automated sonar imagery generation 500 is performed (shown in FIG. 4D), trip replay 1000B can be created.) In the illustrated embodiment, sonar display 1002A appears on the right side of trip replay 1000A, and map display 1004A appears on the left side of trip replay 1000A. In general, sonar display 1002A is contemporaneously coordinated with map display 1004A. More specifically, sonar pings down indicating line 1006A shown in sonar display 1002A occurred at the location of indicating point 1008A on map display 1004A.

An entire trip along pathway 1010A can be illustrated in trip replay 1000A, with sonar display 1002A, indicating line 1006A, map display 1004A, and indicating point 1008A moving progressively together. This allows for user 32A (shown in FIG. 1) to watch the entire trip along pathway 1010A in order to verify that the output from automated contour map generation 200 matches what is indicated by the sonar data.

Figure 9:
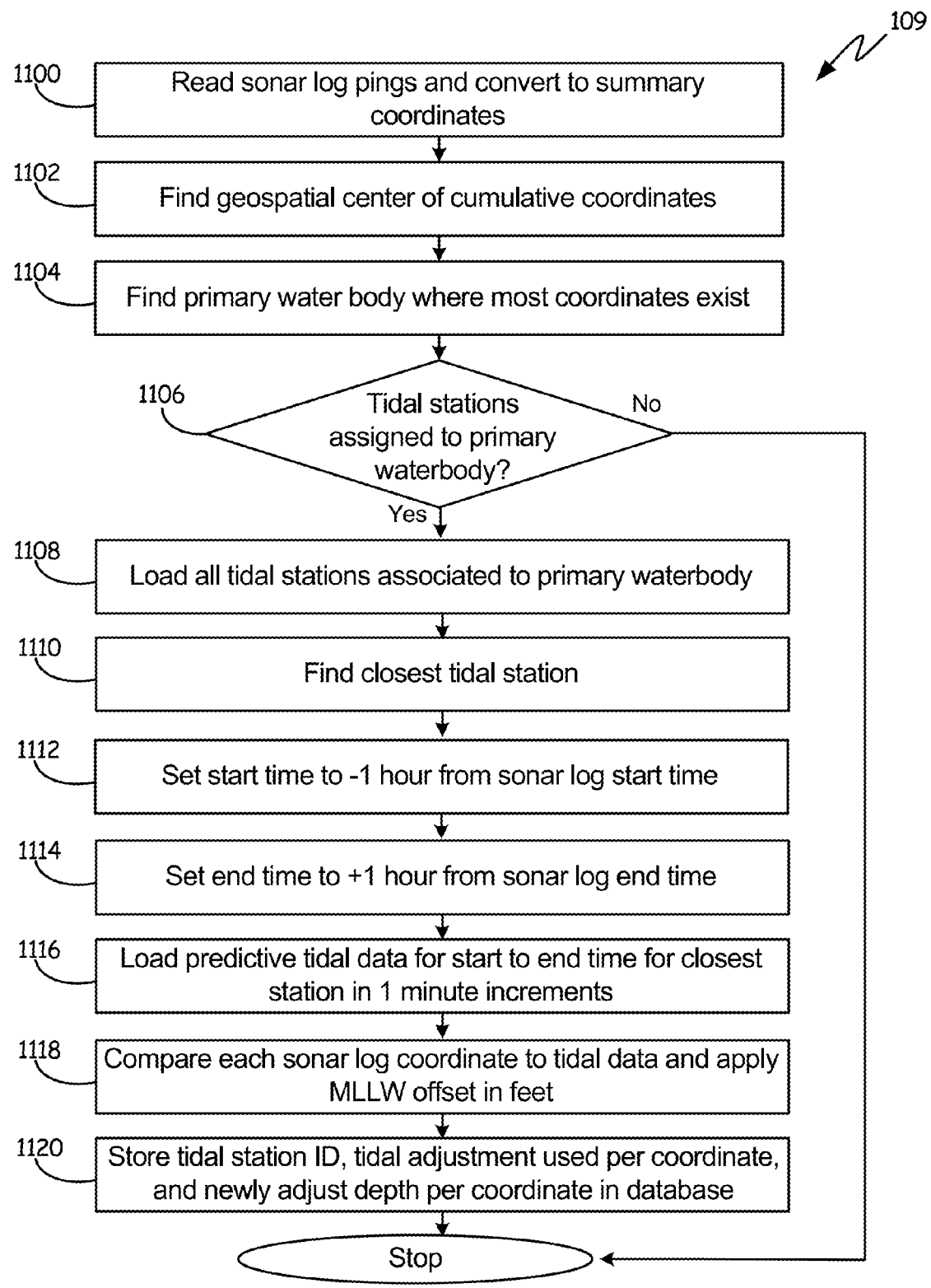
FIG. 9 shows a flow chart of automated depth adjustment for geo-statistical data based on tidal data.

In FIG. 9, a flow chart of one embodiment of automated depth adjustment step 109 for geo-statistical data based on tidal data is shown. The depth adjustment process can be performed by, for example, monitoring system processor 26 (shown in FIG. 1).

At step 1100, the sonar log pings are read and converted to summary coordinates. At step 1102, the geospatial center of the cumulative coordinates is found, and the primary water body where most of the coordinates exist is found at step 1104. At step 1106 it is determined whether there are any tidal stations assigned to this primary water body. If there are none, then step 109 can be completed and data processing can continue at step 110 (shown in FIG. 3). This would be the case where the primary water body is an inland lake, river, or stream.

On the other hand, if there is a tidal station assigned to the primary water body, then all the tidal stations assigned to the primary water body are loaded at step 1108. At step 1110, the closest tidal station is found using the geospatial center of the coordinates found in step 1102. At step 1112, one hour is subtracted from the start time of the sonar log, and one hour is added to the end time of the sonar log at step 1114. Then the predictive tidal data from the closest tidal station is loaded between the times calculated in steps 1112 and 1114 in one minute increments. The depth data for each sonar log coordinate is compared to the predictive tidal data and the Mean Lower Low Water (MLLW) offset in feet is applied (i.e. added or subtracted) at step 1108. This occurs individually at each depth data point and the amount of correction to apply depends on the time (i.e. the particular minute) that the data point was measured. At step 1120, the tidal station, tidal adjustment, and adjusted depth for each coordinate data point is recorded in database 28 (shown in FIG. 1).

Illustrated in FIG. 9 is one embodiment of automated depth adjustment step 109, for which there are alternative embodiments. For example, multiple tidal stations can be used can be used to adjust different data points within the data set depending on their respective locations. For another example, geospatial and directional calculations can be made to determine the flow of the tide using three or more tidal stations, which can increase the accuracy of the depth adjustment for each data point. For a further example, actual tidal data can be used instead of predictive tidal data for stations that measure actual tidal data.

It should be recognized that the present invention provides numerous benefits and advantages. For example, GIS 20 data can be processed automatically such that it can be layered on top of a map. For another example, outputs that are automatically generated can be verified by a user with the sonar image, which increases the scientific confidence in the outputs.

Further information can be found in U.S. patent application Ser. No. 12/784,138, entitled "SYSTEMS, DEVICES, METHODS FOR SENSING AND PROCESSING FISHING RELATED DATA," filed May 20, 2010, by Lauenstein et al., which is herein incorporated by reference.

Description of Possible Embodiments

The following are non-exclusive descriptions of possible embodiments of the present invention.

A geographic information system according to an exemplary embodiment of this disclosure, among other possible things comprises: a server that is connected to a network; a database connected to the server; and a plurality of database entries, each database entry comprising: an identifier; and a plurality of data points representing a water body parameter; wherein the database is accessible by an authenticated user and wherein the user can access a select group of the plurality of database entries.

The geographic information system of the preceding paragraph can optionally include, additionally and/or alternatively, any one or more of the following features, configurations, and/or additional components:

A further embodiment of the foregoing geographic information system, wherein the identifier can include a user identifier, a trip identifier, and a water body identifier.

A geographic information system according to an exemplary embodiment of this disclosure, among other possible things comprises: a server that is connected to a network; a database connected to the server; a first database entry comprising: a first identifier; and a first plurality of data points representing a water body parameter; and a second database entry comprising: a second identifier; and a second plurality of data points representing a water body parameter; wherein the server combines the first and second pluralities of data points in order to process the first and second pluralities of data points.

The geographic information system of the preceding paragraph can optionally include, additionally and/or alternatively, any one or more of the following features, configurations, and/or additional components:

A further embodiment of the foregoing geographic information system can comprise: a third database entry that includes the first and second pluralities of data points wherein the server processes the third database entry.

A method of processing geo-statistical data according to an exemplary embodiment of this disclosure, among other possible things, comprises: preparing a data log; extracting acoustic data and coordinate data from the data log; aligning the acoustic data and the coordinate data; cleaning and aggregating the coordinate data; validating the coordinate data geospatially; and creating an output.

The method of the preceding paragraph can optionally include, additionally and/or alternatively, any one or more of the following features, configurations, and/or additional components:

A further embodiment of the foregoing method, wherein the output can be a contour map.

A method of reporting geo-statistical data according to an exemplary embodiment of this disclosure, among other possible things, comprises: providing a contour map of a water body having a plurality of depth ranges; correlating a water body parameter to at least one of the depth ranges.

The method of the preceding paragraph can optionally include, additionally and/or alternatively, any one or more of the following features, configurations, and/or additional components:

A further embodiment of the foregoing method can comprise: correlating a water body parameter to each depth range.

A method of selecting data presentation according to an exemplary embodiment of this disclosure, among other possible things, comprises: preparing a data log; extracting depth data and coordinate data from the data log; aligning the depth data and the coordinate data; cleaning and aggregating the coordinate data; validating the coordinate data geospatially; creating a first contour map with a first plurality of depth ranges from the coordinate data; and creating a second contour map with a second plurality of depth ranges.

The method of the preceding paragraph can optionally include, additionally and/or alternatively, any one or more of the following features, configurations, and/or additional components:

A further embodiment of the foregoing method, wherein the first plurality of depth ranges can be differentiated by 0.30 meters and the second plurality of depth ranges can be differentiated by 0.91 meters.

A method of measuring using data according to an exemplary embodiment of this disclosure, among other possible things, comprises: preparing a data log; extracting acoustic data and coordinate data from the data log; aligning the acoustic data and the coordinate data; creating a contour map with the acoustic data and the coordinate data; creating a polygon on the contour map; analyzing at least one of the acoustic data and the coordinate data within the polygon.

A method of adjusting altitude data according to an exemplary embodiment of this disclosure, among other possible things, comprises: preparing a data log; extracting altitude data and coordinate data from the data log; aligning the altitude data and the coordinate data; cleaning and aggregating the coordinate data; averaging the altitude data to obtain an average altitude; and replacing the altitude data with the average altitude at each coordinate.

A method of adjusting altitude data according to an exemplary embodiment of this disclosure, among other possible things, comprises: preparing a data log; extracting altitude data and coordinate data from the data log; aligning the altitude data and the coordinate data; cleaning and aggregating the coordinate data; changing the altitude at each coordinate by a given value.

A method of replaying measured data according to an exemplary embodiment of this disclosure, among other possible things, comprises: preparing a data log using measured parameters that were measured along a pathway; extracting acoustic data and coordinate data from the data log; aligning the acoustic data and the coordinate data; creating a contour map including the pathway taken while measuring the parameters; creating a sonar image from the acoustic data; and displaying simultaneously the contour map and the sonar image.

The method of the preceding paragraph can optionally include, additionally and/or alternatively, any one or more of the following features, configurations, and/or additional components:

A further embodiment of the foregoing method can further comprise: indicating a first position along the sonar image; and indicating a second position along the pathway that is aligned with the first position along the sonar image.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of replaying measured data points, the method comprising:
receiving, via a monitoring system, a plurality of positions of a watercraft as the watercraft travels across a body of water;
recording the received plurality of positions of the watercraft;
receiving, via the monitoring system, a plurality of sets of sonar pings from the body of water as the watercraft travels across the body of water, wherein each set of sonar pings corresponds to one of the plurality of positions of the watercraft;
recording the received plurality of sets of sonar pings;
aligning each set of sonar pings to the corresponding one of the plurality of positions at which each set of the sonar pings was received;
generating a sonar image using the plurality of sets of sonar pings;
displaying a map of the body of water along with a pathway with an indicating point, wherein the pathway represents the plurality of positions of the watercraft as the watercraft traveled across the body of water, wherein the indicating point represents one of the plurality of positions of the watercraft; and
displaying the sonar image along with an indicating line, wherein the indicating line on the sonar image represents a set of sonar pings that corresponds to the position of the watercraft represented by the indicating point on the pathway of the map.

2. The method of claim 1 further comprising:
progressing the indicating point along the pathway; and
progressing the displaying of the sonar image such that the indicating line remains coordinated with the indicating point.

3. The method of claim 1, wherein displaying the sonar image comprises:
   displaying a representation of a plurality of sets of sonar pings that includes one or more sets of sonar pings before the indicating line and one or more sets of sonar pings after the indicating line.

4. The method of claim 1, wherein the map is a contour map.

5. The method of claim 1, wherein the map includes a plurality of depth ranges.

6. The method of claim 5 further comprising:
   verifying the plurality of depth ranges on the map using the sonar image.

7. The method of claim 5 further comprising:
   receiving a plurality of measurements of a parameter of the body of water from the monitoring system at the plurality of positions of the watercraft;
   aligning each of the plurality of measurements to each of the plurality of positions at which each of the plurality of measurements was received;
   correlating the parameter of the body of water to at least one of the plurality of depth ranges; and
   displaying the correlated parameter on the map.

8. The method of claim 1, wherein the parameter of the body of water describes one of water temperature, barometric pressure, plant height, plant biovolume, area covered by plants, biomass, substrate hardness/softness, and bottom hardness/softness.

9. The method of claim 1, wherein each of set of sonar pings occupies one pixel width in the sonar image.

10. The method of claim 1, wherein the map and the sonar image are displayed side-by-side.

11. A geographic information display system comprising:
    a monitoring system comprising:
       a positioning system configured to determine and record a plurality of positions of a watercraft as the watercraft travels across a body of water;
       at least one sonar system configured to receive and record a plurality of sets of sonar pings from the body of water as the watercraft travels across the body of water,
       wherein each set of sonar pings corresponds to one of the plurality of position of the watercraft; and
    a processor configured to:
       align each set of sonar pings to the corresponding one of the plurality of positions at which each set of sonar pings was received; and
       generate a sonar image using the plurality of sets of sonar pings; and
    a display configured to:
       display a map of the body of water along with a pathway with an indicating point, wherein the pathway represents the plurality of positions of the watercraft as the watercraft traveled across the body of water, and
       wherein the indicating point represents one of the plurality of positions of the watercraft; and
          display the sonar image along with an indicating line, wherein the indicating line on the sonar image represents a set of sonar pings that corresponds to the position of the watercraft represented by the indicating point on the pathway of the map.

12. The geographic information display system of claim 11, wherein the monitoring system further comprises:
    a water body parameter measurement device for measuring at least one of water temperature, barometric pressure, plant height, plant biovolume, area covered by plants, biomass, substrate hardness/softness, and bottom hardness/softness.

13. The geographic information display system of claim 11, wherein the display is configured to move the indicating point along the pathway and the sonar display is configured to move the sonar image such that the indicating line corresponds to the indicating point.

14. The geographic information display system of claim 11, wherein the display is configured to display the sonar image by displaying a representation of a plurality of sets of sonar pings that includes one or more sets of sonar pings before the indicating line and one or more sets of sonar pings after the indicating line.

15. The geographic information display system of claim 11, wherein the map is a contour map that includes a plurality of depth ranges.

16. The geographic information display system of claim 15, wherein the map further comprises:
    a water body parameter display superimposed on the map.

17. The geographic information display system of claim 16, wherein the water body parameter describes one of water temperature, barometric pressure, plant height, plant biovolume, area covered by plants, biomass, substrate hardness/softness, and bottom hardness/softness.

18. The geographic information display system of claim 15, wherein the contour plurality of depth ranges are based on depth information received from the plurality of sonar pings.

19. The geographic information display system of claim 11, wherein each set of sonar pings occupies one pixel width in the sonar display.

20. The geographic information display system of claim 11, wherein the display is configured to display the map and the sonar image side-by-side.

* * * * *